US010325815B2

(12) United States Patent
Bao et al.

(10) Patent No.: US 10,325,815 B2
(45) Date of Patent: *Jun. 18, 2019

(54) VERTICAL TRANSPORT FIN FIELD EFFECT TRANSISTORS HAVING DIFFERENT CHANNEL LENGTHS

(71) Applicant: INTERNATIONAL BUSINESS MACHINES CORPORATION, Armonk, NY (US)

(72) Inventors: Ruqiang Bao, Wappingers Falls, NY (US); Choonghyun Lee, Rensselaer, NY (US); Shogo Mochizuki, Clifton Park, NY (US); Chun W. Yeung, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/963,402

(22) Filed: Apr. 26, 2018

(65) Prior Publication Data

US 2018/0358268 A1    Dec. 13, 2018

Related U.S. Application Data

(63) Continuation of application No. 15/620,369, filed on Jun. 12, 2017, now Pat. No. 10,008,417.

(51) Int. Cl.
*H01L 21/40* (2006.01)
*H01L 21/8234* (2006.01)
(Continued)

(52) U.S. Cl.
CPC .............. *H01L 21/823487* (2013.01); *H01L 21/823412* (2013.01); *H01L 21/823418* (2013.01);
(Continued)

(58) Field of Classification Search
CPC ..... H01L 21/823885; H01L 21/823437; H01L 21/823814
See application file for complete search history.

(56) References Cited

U.S. PATENT DOCUMENTS 6,717,200 B1    4/2004  Schamberger et al.
8,866,219 B2   10/2014  Kim
(Continued)

FOREIGN PATENT DOCUMENTS

CN    104282766 A    5/2015
KR    100827514 B1    5/2008

OTHER PUBLICATIONS

International Search Report with cited art in corresponding International Application No. PCT/IB2018/054085 dated Aug. 30, 2018.
(Continued)

*Primary Examiner* — Thomas L Dickey
(74) *Attorney, Agent, or Firm* — Tutunjian & Bitetto, P.C.; Vazken Alexanian

(57) ABSTRACT

A method of forming multiple vertical transport fin field effect transistors (VT FinFETs) having different channel lengths, including, forming a vertical fin on a first region of a substrate and a vertical fin on a second region of the substrate, forming a cover block on the vertical fin on the second region of the substrate, forming a first bottom source/drain on the first region of the substrate, wherein the first bottom source/drain covers a lower portion of the vertical fin on the first region, removing the cover block, and forming a second bottom source/drain in the second region of the substrate, wherein the second bottom source/drain is below the surface of the substrate, wherein the second bottom source/drain does not cover a lower portion of the vertical fin on the second region.

20 Claims, 10 Drawing Sheets

(51) Int. Cl.
*H01L 27/088* (2006.01)
*H01L 21/8238* (2006.01)
*H01L 27/092* (2006.01)

(52) U.S. Cl.
CPC .... *H01L 21/823456* (2013.01); *H01L 27/088* (2013.01); *H01L 21/823814* (2013.01); *H01L 21/823892* (2013.01); *H01L 27/092* (2013.01)

(56) References Cited

U.S. PATENT DOCUMENTS

| | | |
|---|---|---|
| 9,368,572 B1 | 6/2016 | Cheng et al. |
| 9,437,503 B1 | 9/2016 | Mallela et al. |
| 10,008,417 B1 * | 6/2018 | Bao ................ H01L 21/823487 |
| 2008/0272431 A1 | 11/2008 | Kim et al. |
| 2014/0151757 A1 | 6/2014 | Basu et al. |
| 2015/0145068 A1 | 5/2015 | Chen et al. |
| 2015/0380548 A1 | 12/2015 | Wang et al. |

OTHER PUBLICATIONS

List of IBM Patents or Patent Applications Treated as Related dated Apr. 26, 2018, 2 pages.

* cited by examiner

VERTICAL TRANSPORT FIN FIELD EFFECT TRANSISTORS HAVING DIFFERENT CHANNEL LENGTHS

BACKGROUND

Technical Field

The present invention generally relates to forming multiple vertical transport fin field effect transistors (VT Fin-FETs) on the same substrate, and more particularly to forming VT FinFETs having different channel lengths, while maintaining uniform spacer thicknesses, by utilizing both epitaxial growth and ion implantation to form bottom source/drains.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (NFET) or a p-type FET (PFET) can be formed. An NFET and a PFET can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of forming multiple vertical transport fin field effect transistors (VT FinFETs) having different channel lengths is provided. The method includes forming a vertical fin on a first region of a substrate and a vertical fin on a second region of the substrate. The method further includes forming a cover block on the vertical fin on the second region of the substrate. The method further includes forming a first bottom source/drain on the first region of the substrate, wherein the first bottom source/drain covers a lower portion of the vertical fin on the first region. The method further includes removing the cover block and forming a second bottom source/drain in the second region of the substrate, wherein the second bottom source/drain is below the surface of the substrate, wherein the second bottom source/drain does not cover a lower portion of the vertical fin on the second region.

In accordance with another embodiment of the present invention, a method of forming multiple vertical transport fin field effect transistors (VT FinFETs) having different channel lengths is provided. The method includes forming a plurality of vertical fins on a substrate, where at least one of the plurality of vertical fins is on a first region of the substrate and at least one of the plurality of vertical fins is on a second region of the substrate. The method further includes forming a cover block on the at least one of the plurality of vertical fins on the second region of the substrate. The method further includes forming a first bottom source/drain on the first region of the substrate, wherein the first bottom source/drain is formed by epitaxial growth on the first region of the substrate. The method further includes removing the cover block. The method further includes forming a second bottom source/drain in the second region of the substrate, wherein the second bottom source/drain is formed by ion implantation into the second region of the substrate, and wherein the first bottom source/drain and second bottom source/drain are at two different elevations on the substrate. The method further includes forming a first bottom spacer on the first bottom source/drain on the first region of the substrate, and a second bottom spacer on the second bottom source/drain on the second region of the substrate.

In accordance with yet another embodiment of the present invention, a plurality of vertical transport fin field effect transistors (VT FinFETs) having different channel lengths is provided. The plurality of vertical transport fin field effect transistors includes a vertical fin on a first region of a substrate and a vertical fin on a second region of the substrate. The plurality of VT FinFETs further includes a first bottom source/drain on the first region of the substrate, wherein the first bottom source/drain covers a lower portion of the vertical fin on the first region. The plurality of VT FinFETs further includes a second bottom source/drain in the second region of the substrate, wherein the first bottom source/drain and second bottom source/drain are at two different elevations on the substrate. The plurality of VT FinFETs further includes a first bottom spacer on the first bottom source/drain on the first region of the substrate, and a second bottom spacer on the second bottom source/drain on the second region of the substrate.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming vertical transport fin field effect transistors (VT FinFETs) having different channel lengths on the same substrate by using different fabrication processes to form bottom source/drains, while retaining the same processes to form the vertical fins, top spacers, and bottom spacers. Forming vertical transport fin field effect transistors (VT FinFETs) having different channel lengths on the same substrate can provide for balancing circuit performance and power consumption.

Embodiments of the present invention relate generally to forming a bottom source/drains on a first region of a substrate using epitaxial growth to raise the top surface, and forming a bottom source/drains on a second region of a substrate using ion implantation to maintain the height of the substrate in the second region. Utilizing a growth process on a region of the substrate allows control of the final surface height adjacent to the vertical fins in the second region, whereas using a dopant implantation process avoids changes to the surface height.

Embodiments of the present invention relate generally to forming a bottom spacer having a uniform thickness on vertical fins having different heights by forming the bottom spacer on both the first region and second region at the same time. Maintaining uniform bottom spacer thickness and uniform top spacer thickness can avoid variations in the size of the doped extension region of the vertical fins and junctions with the bottom source/drain, and avoid high parasitic source/drain resistance.

Exemplary applications/uses to which the present invention can be applied include, but are not limited to: formation of complementary metal-oxide-semiconductor (CMOS) devices utilizing VT FinFETs, logic devices, and memory devices.

Figure 1:
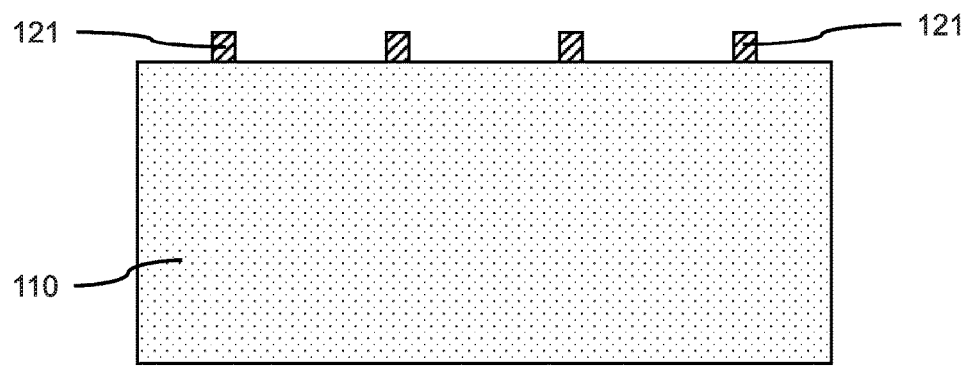
FIG. 1 is a cross-sectional side view showing a plurality of fin templates on a substrate, in accordance with an embodiment of the present invention.

Referring now to the drawings in which like numerals represent the same or similar elements and initially to FIG. 1, a cross-sectional side view of a plurality of fin templates on a substrate is shown, in accordance with an embodiment of the present invention.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $Al_2O_3$, $SiO_2$, GaAs, SiC, Si:C, or SiGe.

The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides.

In one or more embodiments, the substrate 110 can be a semiconductor wafer, for example, a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a fin template layer can be formed on the surface of the substrate and patterned to form one or more fin templates 121. The fin template layer can be blanket deposited and lithographic processes used to pattern and etch the fin template layer. In various embodiments, a plurality of fin templates 121 can be formed by a sidewall image transfer (SIT) process, self-aligned double patterning (SADP) process, or self-aligned quadruple patterning (SAQP) process, to provide a tight pitch. In various embodiments, a direct print can be used to provide fin templates 121 from the fin template layer.

In various embodiments, the fin templates 121 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof, where the fin templates 121 may include one or more layers.

Figure 2:
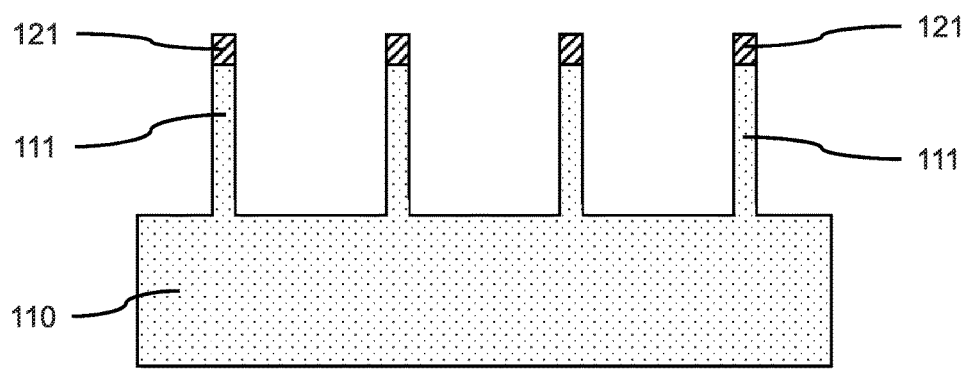
FIG. 2 is a cross-sectional side view showing a plurality of vertical fins formed from the substrate, in accordance with an embodiment of the present invention.

FIG. 2 is a cross-sectional side view showing a plurality of vertical fins formed from the substrate, in accordance with an embodiment of the present invention.

In one or more embodiments, vertical fins 111 can be formed from the substrate 110 using a directional etch, for example, a reactive ion etch (RIE), where the fin template(s) 121 mask a portion of the substrate 110.

In various embodiments, a plurality of vertical fins 111 can be formed by a sidewall image transfer (SIT) process, self-aligned double patterning (SADP) process, or self-aligned quadruple patterning (SAQP) process, to provide a tight pitch between vertical fins 111. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. These other processes are also contemplated, and the scope of the claims and invention should not be limited to the particular illustrated features.

The vertical fins 111 can be the same material as the substrate 110. The vertical fins 111 can have a height in the range of about 20 nm to about 80 nm, or in the range of about 30 nm to about 60 nm, although other heights are also contemplated.

Figure 3:
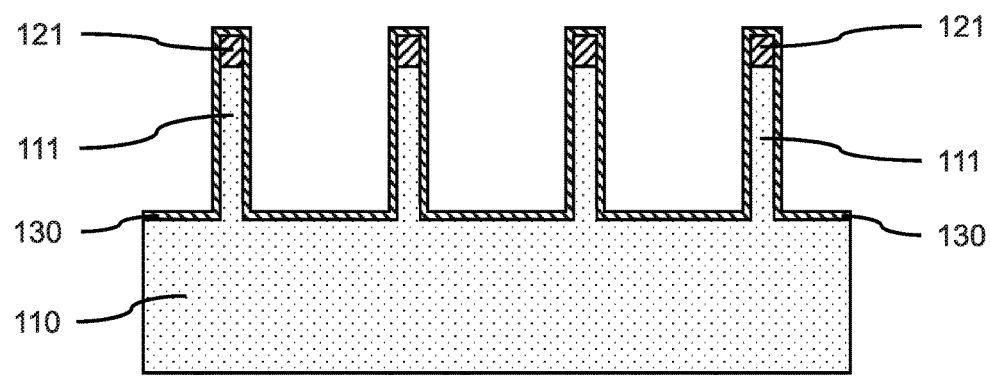
FIG. 3 is a cross-sectional side view showing a protective inner liner formed on the plurality of vertical fins, in accordance with an embodiment of the present invention.

FIG. 3 is a cross-sectional side view showing a protective inner liner formed on the plurality of vertical fins, in accordance with an embodiment of the present invention.

In one or more embodiments, a protective inner liner 130 can be formed on the plurality of vertical fins 111, fin templates 121, and exposed surface of the substrate 110, where the protective inner liner 130 can be formed by a conformal deposition, for example, atomic layer deposition (ALD) or plasma enhanced atomic layer deposition (PEALD).

The protective inner liner 130 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof. The protective inner liner 130 can be the same material as the fin templates 121, or the materials can be different to allow selective etching.

Figure 4:
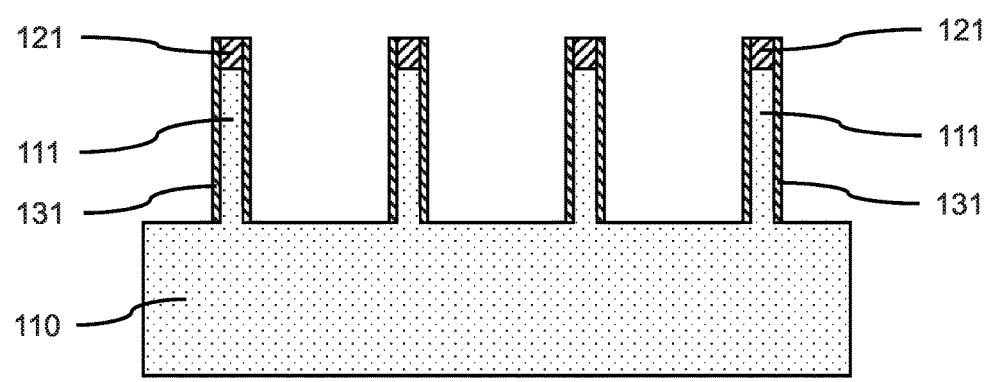
FIG. 4 is a cross-sectional side view showing exposed portions of the substrate after removal of the protective inner liner from the substrate surface, in accordance with an embodiment of the present invention.

FIG. 4 is a cross-sectional side view showing exposed portions of the substrate after removal of the protective inner liner from the substrate surface, in accordance with an embodiment of the present invention.

In one or more embodiments, portions of the protective inner liner 130 can be removed from the substrate surface and top surface of the fin templates 121 using a directional etch (e.g., RIE). Removal of the protective inner liner 130 can expose portions of the substrate 110 adjacent to the vertical fins 111.

Figure 5:
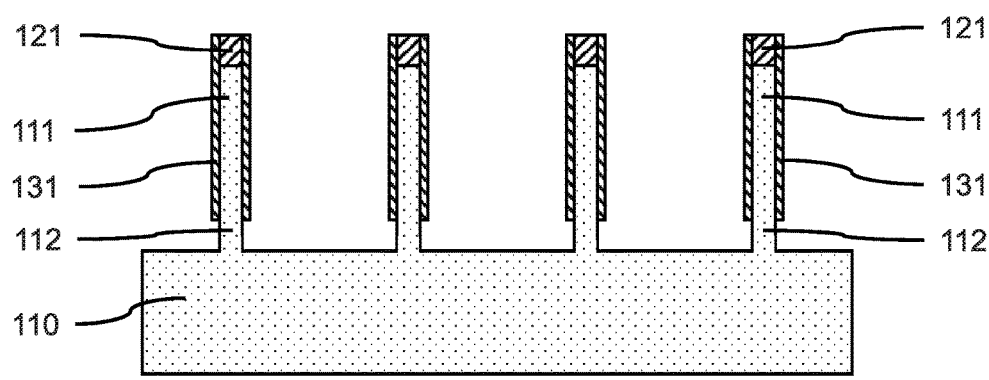
FIG. 5 is a cross-sectional side view showing a further recessed substrate to form exposed fin extensions, in accordance with an embodiment of the present invention.

FIG. 5 is a cross-sectional side view showing a further recessed substrate to form exposed fin extensions, in accordance with an embodiment of the present invention.

In one or more embodiments, the substrate surface can be further recessed by removing an upper portion of the substrate, where the substrate can be removed using a selective, directional etch (e.g., RIE). Recessing the substrate surface can form fin extensions 112 below each of the vertical fins 111 and protective inner liner 130, which leaves protective liner segments 131 on a portion of the vertical fin sidewalls. The sidewalls of the resulting fin extensions 112 are exposed.

In various embodiments, the substrate can be recessed to a depth in the range of about 15 nm to about 50 nm, or in the range of about 20 nm to about 35 nm. The recess depth can increase the fin height in the range of about 15 nm to about 50 nm, or in the range of about 20 nm to about 35 nm.

Figure 6:
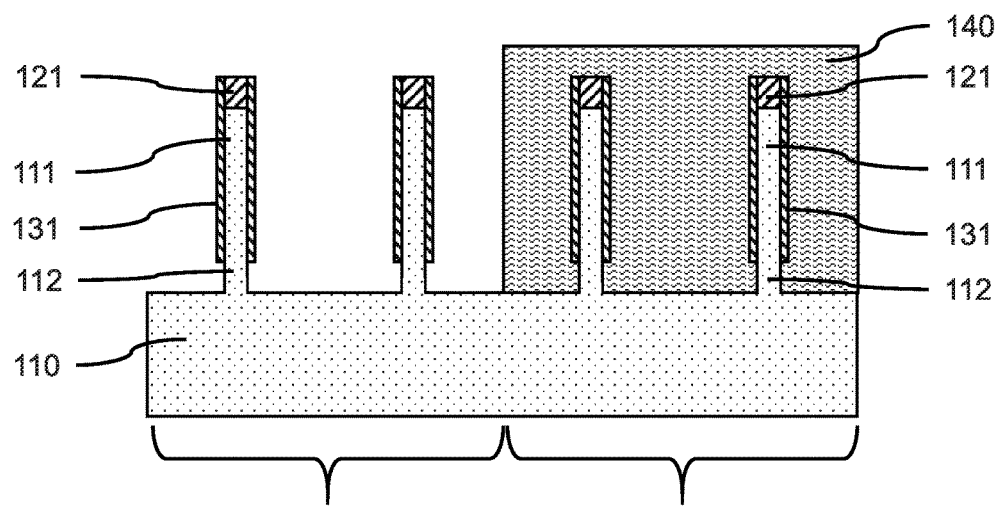
FIG. 6 is a cross-sectional side view showing exposed vertical fins on a first region of the substrate and a cover block formed on a subset of vertical fins on a second region of the substrate, in accordance with an embodiment of the present invention.

FIG. 6 is a cross-sectional side view showing exposed vertical fins on a first region of the substrate and a cover block formed on a subset of vertical fins on a second region of the substrate, in accordance with an embodiment of the present invention.

In one or more embodiments, a cover layer can be formed on the substrate 110 and vertical fins 111. The cover layer can be masked and patterned, and an etch processes used to form a cover block 140 on a second region of the substrate 102, whereas the vertical fins 111, fin templates, and protective inner liner 130 is exposed on a first region of the substrate 101.

The cover block 140 can be silicon oxide (SiO), a low-k dielectric material, for example, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 7:
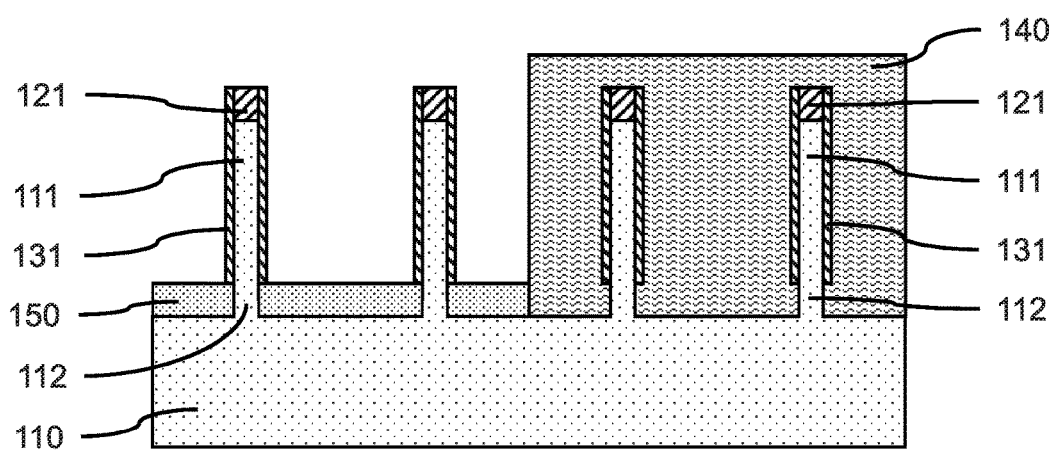
FIG. 7 is a cross-sectional side view showing a first bottom source/drain formed on the first region of the substrate adjoining the exposed fin extensions, in accordance with an embodiment of the present invention.

FIG. 7 is a cross-sectional side view showing a first bottom source/drain formed on the first region of the substrate adjoining the exposed fin extensions, in accordance with an embodiment of the present invention.

In one or more embodiments, a first bottom source/drain 150 can be formed on the exposed substrate 110 in the first region 101, where the first bottom source/drain 150 can be formed by an epitaxial growth process. The first bottom source/drain 150 can be grown from the surface of the substrate up to a predetermined height, where the height can be the height of the fin extensions 112. The first bottom source/drain 150 can cover a lower portion of the vertical fin 111 on the first region 101, where the lower portion can be below the protective liner segments 131. The formation of the first bottom source/drain can reduce the height of the vertical fins 111 above the surface of the first bottom source/drain.

In one or more embodiments, the first bottom source/drain 150 can be grown to a height (i.e., thickness) in the range of about 15 nm to about 50 nm, or in the range of about 20 nm to about 35 nm.

In various embodiments, the first bottom source/drain 150 in the first region 101 can be doped to be a p-type bottom source/drain or an n-type bottom source/drain. The first bottom source/drain 150 can have the same crystal orientation as the substrate.

Figure 8:
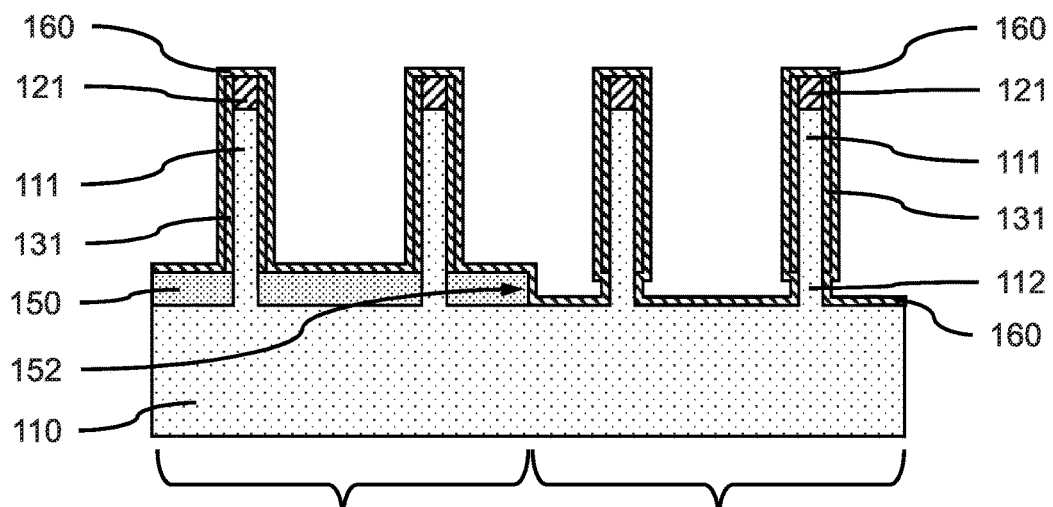
FIG. 8 is a cross-sectional side view showing a protective outer liner formed on the first bottom source/drain in the first region and on the substrate in the second region, in accordance with an embodiment of the present invention.

FIG. 8 is a cross-sectional side view showing a protective outer liner formed on the first bottom source/drain in the first region and on the substrate in the second region, in accordance with an embodiment of the present invention.

In one or more embodiments, the cover block 140 can be removed, where the cover block 140 can be removed after formation of the first bottom source/drain 150 using a selective etch (e.g., wet chemical etch, dry plasma etch, etc.). Removal of the cover block can expose the surface of the substrate 110 in the second region 102, and expose the protective liner segments 131 on the vertical fins 111 on the second region 102. Removal of the cover block can expose a source/drain step 152 formed by the first bottom source/drain 150 transitioning from the first region to the second region. The top surface of a first bottom source/drain is at a different elevation than the substrate surface.

In one or more embodiments, a protective outer liner 160 can be formed on the first bottom source/drain 150, the exposed surface of the substrate 110 in the second region 102, and on the expose the protective liner segments 131 on the vertical fins 111 on both regions 101, 102.

The protective outer liner 160 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof. The protective outer liner 160 can be the same material as the protective inner liner 130, or the materials can be different to allow selective etching.

Figure 9:
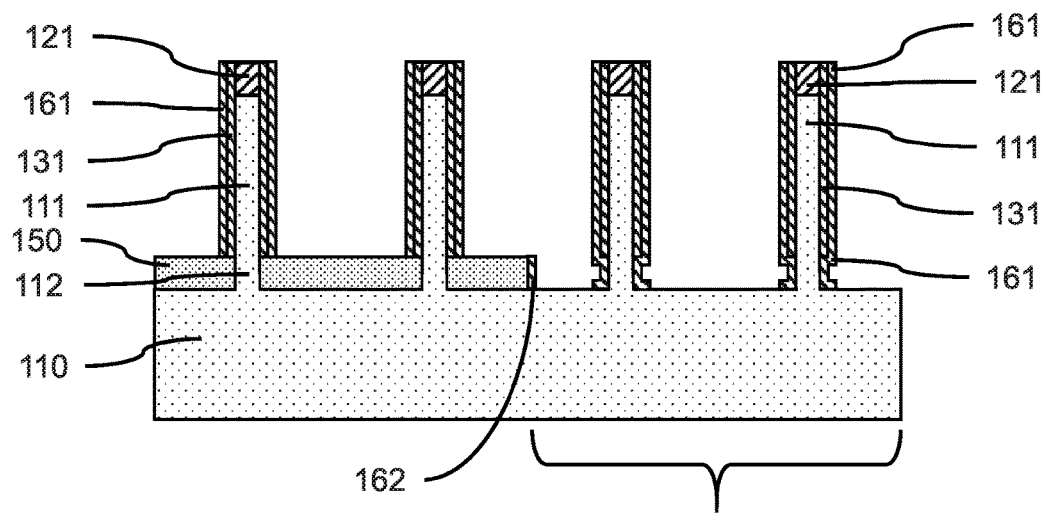
FIG. 9 is a cross-sectional side view showing an exposed first bottom source/drain and exposed substrate after removal of a portion of the protective outer liner, in accordance with an embodiment of the present invention.

FIG. 9 is a cross-sectional side view showing an exposed first bottom source/drain and exposed substrate after removal of a portion of the protective outer liner, in accordance with an embodiment of the present invention.

In one or more embodiments, portions of the protective outer liner 160 can be removed from the substrate surface, first bottom source/drain 150, and top surfaces of the fin templates 121 using a selective, directional etch (e.g., RIE). Removal of portions of the protective outer liner 160 can expose portions of the substrate 110 adjacent to the vertical fins 111 in the second region 102. Removal of portions of the protective outer liner 160 from the top surfaces of the fin templates 121 can form protective outer segments 161 on the sidewalls of the vertical fins 111.

In various embodiments, the protective outer liner 160 and protective liner segments 131 can shadow a portion of the substrate 110 directly adjacent to the vertical fins 111. A portion of the protective outer liner 160 can remain adjoining the sidewall of the vertical fins 111. A portion of the protective outer liner 160 can also remain adjoining the sidewall of the first bottom source/drain 150 to form a separation pillar 162.

Figure 10:
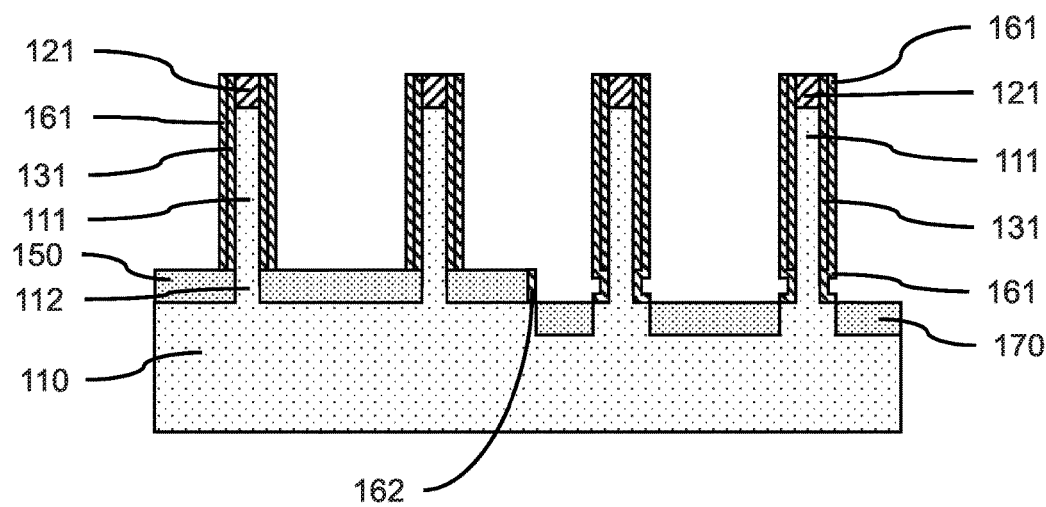
FIG. 10 is a cross-sectional side view showing formation of a second bottom source/drain formed in the second region of the substrate below the vertical fins, in accordance with an embodiment of the present invention.

FIG. 10 is a cross-sectional side view showing formation of a second bottom source/drain formed in the second region of the substrate below the vertical fins, in accordance with an embodiment of the present invention.

In one or more embodiments, a second bottom source/drain 170 can be formed in the second region 102 of the substrate 110, where the second bottom source/drain 170 can be formed by an ion implantation process. Any suitable doping techniques can be used, including, but not limited to, ion implantation and plasma doping, to form the second bottom source/drain 170 in the substrate. The second bottom source/drain 170 can be below the surface of the substrate 110, such that the second bottom source/drain does not cover a lower portion of the vertical fin 111 on the second region 102. The height of the vertical fin 111 on the second region, therefore, is not effected by formation of the second bottom source/drain. The first bottom source/drain and second bottom source/drain 170 can be at two different elevations on the same substrate 110.

In one or more embodiments, the second bottom source/drain 170 can be formed in the substrate 110 to a depth in the range of about 15 nm to about 50 nm, or in the range of about 20 nm to about 35 nm.

In various embodiments, the second bottom source/drain 170 in the second region 102 can be doped to be a p-type bottom source/drain or an n-type bottom source/drain. The second bottom source/drain 170 can have the same crystal orientation as the substrate 110. The first bottom source/drain 150 and second bottom source/drain 170 can have the same dopant polarity type (i.e., n-type or p-type) or different polarities.

In one or more embodiments, the first bottom source/drain 150 can have a dopant concentration in the range of about $5 \times 10^{19}/cm^3$ to about $1 \times 10^{21}/cm^3$. In one or more embodiments, the second bottom source/drain 170 can have a dopant concentration in the range of about $5 \times 10^{19}/cm^3$ to about $1 \times 10^{21}/cm^3$. Dopant implantation of the second bottom source/drain 170 can have no effect on the first bottom source/drain 150.

A gap may be formed between the first bottom source/drain 150 and the second bottom source/drain 170 due to the separation pillar 162, where the width of the gap can be the thickness of the separation pillar 162. The gap may assist in electrically separating the first bottom source/drain 150 from the second bottom source/drain 170. An isolation region may be formed between the first bottom source/drain 150 and the second bottom source/drain 170.

Figure 11:
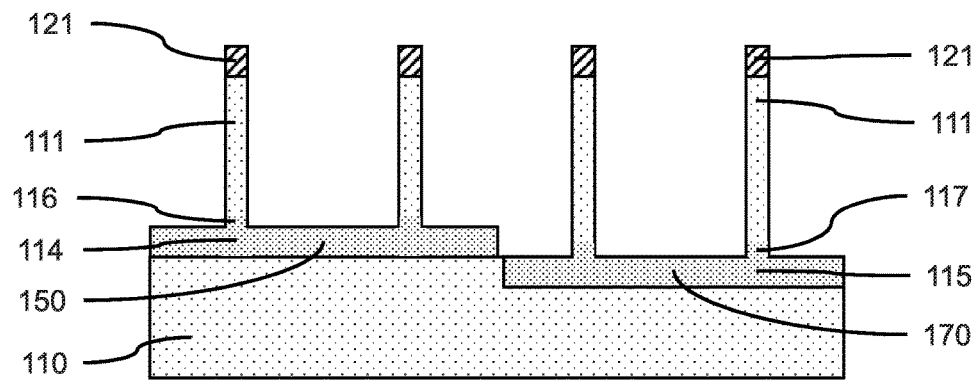
FIG. 11 is a cross-sectional side view showing dopant diffusion from the bottom source/drains into the exposed fin extensions on the first region and areas below the vertical fins in the second region, in accordance with an embodiment of the present invention.

FIG. 11 is a cross-sectional side view showing dopant diffusion from the bottom source/drains into the exposed fin extensions on the first region and areas below the vertical fins in the second region, in accordance with an embodiment of the present invention.

In one or more embodiments, the vertical fins 111, protective liner segments 131, protective outer segments 161, first bottom source/drain 150 and second bottom source/drain 170 can be heat treated to cause diffusion of dopants from the first bottom source/drain 150 and second bottom source/drain 170 into adjoining portions of the vertical fins 111. The diffusion of the n-type or p-type dopants into the vertical fins can form doped fin regions 114 and doped extension regions 116 in the vertical fins in the first region and doped fin regions 115 and doped extension regions 117 in the vertical fins in the second region, where doped fin regions 114 were undoped fin extensions 112.

In one or more embodiments, the protective liner segments 131, protective outer segments 161, and separation pillar 162 can be removed (e.g., etch) from the substrate 110, vertical fins 111, and fin templates 121 to expose the first bottom source/drain 150 and second bottom source/drain 170. The vertical fins 111 on the second region 102 of the substrate 110 can have a greater height than the vertical fins 111 on the first region of the substrate due to the first bottom source/drain 150 covering a portion of the vertical fins 111, and the doped extension region 116 shortening the channel length. The doped extension region 117 can shorten the channel length of the vertical fins 111 in the second region, but the vertical fins have a greater initial height providing longer channels.

Figure 12:
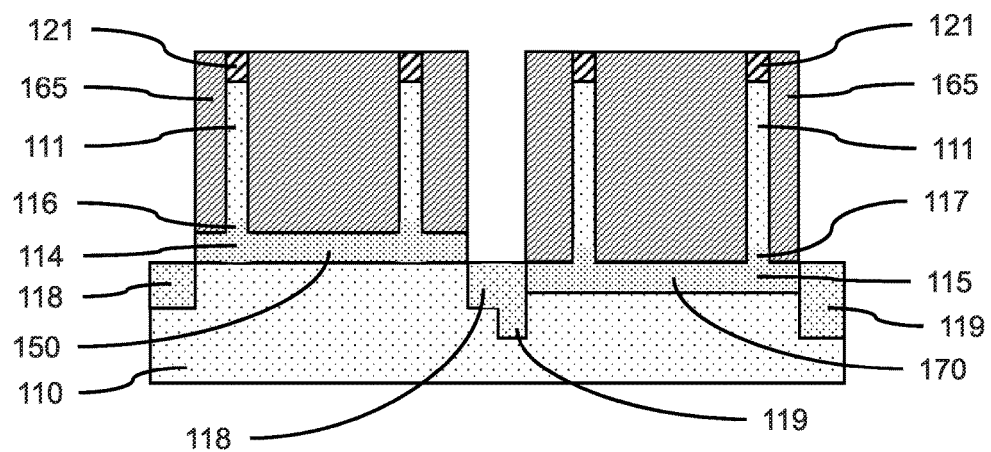
FIG. 12 is a cross-sectional side view showing a hardmask cover portions on portions of the first region and portions of the second region, and isolation regions formed in the substrate, in accordance with an embodiment of the present invention.

FIG. 12 is a cross-sectional side view showing a hardmask cover portions on portions of the first region and portions of the second region, and isolation regions formed in the substrate, in accordance with an embodiment of the present invention.

In one or more embodiments, a hardmask cover layer can be formed on the first bottom source/drain 150, second bottom source/drain 170, vertical fins 111 and fin templates 121. A lithographic resist can be formed and patterned on the hardmask cover layer, and exposed portions of the hardmask cover layer can be removed to form hardmask cover portions 165 on portions of the first region 101 and portions of the second region 102. Each hardmask cover portion 165 can cover vertical fins 111 having different heights.

The hardmask cover portions 165 can be a material that can be selectively removed from the substrate 110, first bottom source/drain 150, second bottom source/drain 170, vertical fins 111 and fin templates 121.

In one or more embodiments, the hardmask cover layer can be patterned to expose portions of the first bottom source/drain 150, second bottom source/drain 170, and/or substrate 110. Portions of the first bottom source/drain 150, second bottom source/drain 170, and substrate 110 can be removed to form isolation troughs in the substrate, and increase the physical distance between the first bottom source/drain 150 and second bottom source/drain 170. The isolation troughs can have a different depths in the first region 101 compared to the second region 102 due to removal of the increased material thickness in the first region 101 created by the formation of the first bottom source/drain 150.

The isolation troughs can be filled with an insulating, dielectric material (e.g., SiO$_2$, low-K dielectric) to form isolation regions 118 in the first region 101 of the substrate, and isolation regions 119 in the second region 102 of the substrate. An isolation region 118 can abut an isolation region 119 where a first bottom source/drain 150 is adjacent to a second bottom source/drain 170. The isolation regions 118 can have a different depth (i.e., thickness) than the isolation regions 119 due to the increased material thickness of the first bottom source/drain 150 etched away in the first region 101. A step may be formed between an isolation region 119 and an isolation region 118 at the juncture of the first region 101 and the second region 102.

Figure 13:
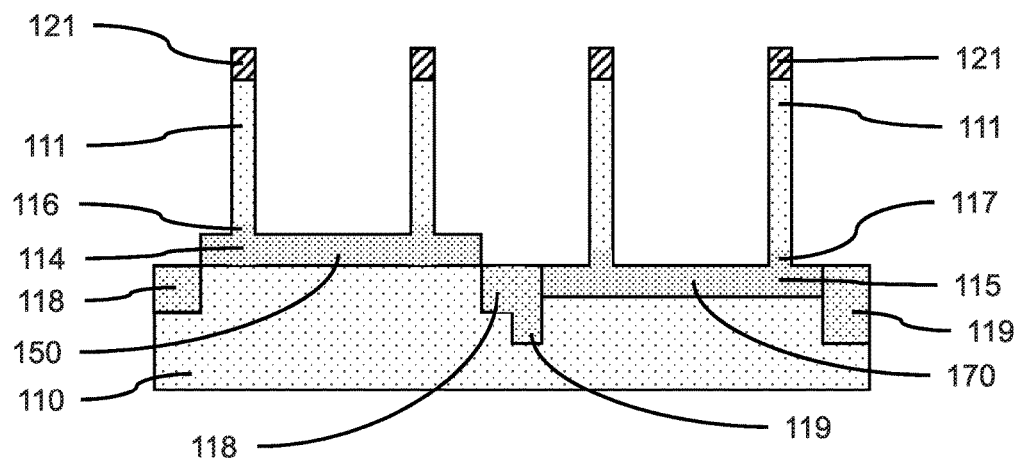
FIG. 13 is a cross-sectional side view showing isolation regions formed in the substrate separating the first bottom source/drain from the second bottom source/drain, in accordance with an embodiment of the present invention.

FIG. 13 is a cross-sectional side view showing isolation regions formed in the substrate separating the first bottom source/drain from the second bottom source/drain, in accordance with an embodiment of the present invention.

In one or more embodiments, the hardmask cover portions 165 can be removed to expose the first bottom source/drain 150, second bottom source/drain 170, and vertical fins 111.

Figure 14:
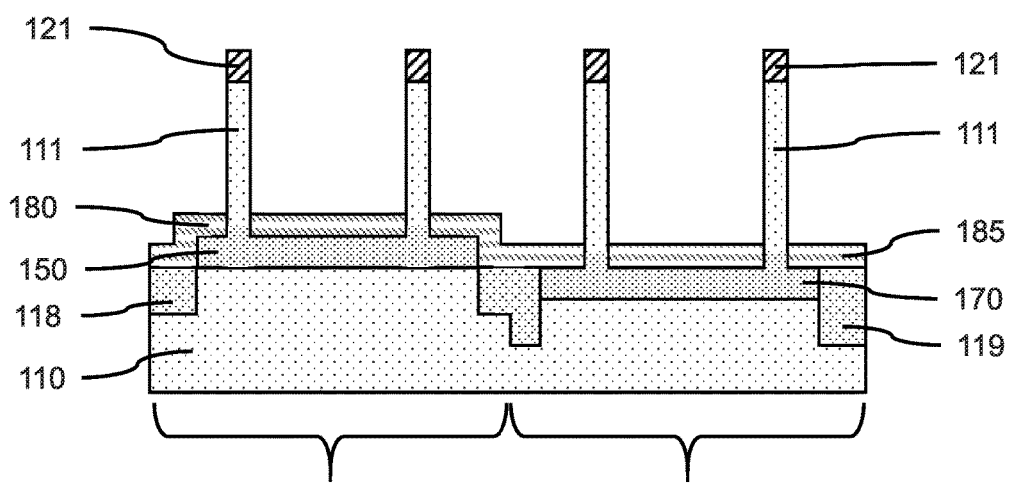
FIG. 14 is a cross-sectional side view showing a bottom spacer formed on the bottom source/drains on the first region and the second region of the substrate, in accordance with an embodiment of the present invention.

FIG. 14 is a cross-sectional side view showing a bottom spacer formed on the bottom source/drains on the first region and the second region of the substrate, in accordance with an embodiment of the present invention.

In one or more embodiments, a bottom spacer layer can be formed on the first region 101 and second region 102 at the same time, where the bottom spacer layer can cover the first bottom source/drain 150, second bottom source/drain 170, and isolation regions 118, 119. The bottom spacer layer can include a first bottom spacer 180 can be formed on the first bottom source/drain 150 on the first region of the substrate, and a second bottom spacer 185 can be formed on the second bottom source/drain 170 on the second region of the substrate.

In one or more embodiments, the first bottom spacer 180 and second bottom spacer 185 can be formed at the same time, where the first bottom spacer 180 and second bottom spacer 185 can be formed by a directional deposition, for example, an ion beam deposition (IBD), physical vapor deposition (PVD), high density plasma (HDP), or a combination thereof, on the first region 101 and the second region 102 at the same time. In various embodiments, the first bottom spacer 180 and second bottom spacer 185 can be silicon nitride (SiN), a high-K dielectric, or a combination thereof.

In one or more embodiments, the first bottom spacer 180 and second bottom spacer 185 can have a thickness in the range of about 4 nm to about 8 nm.

Figure 15:
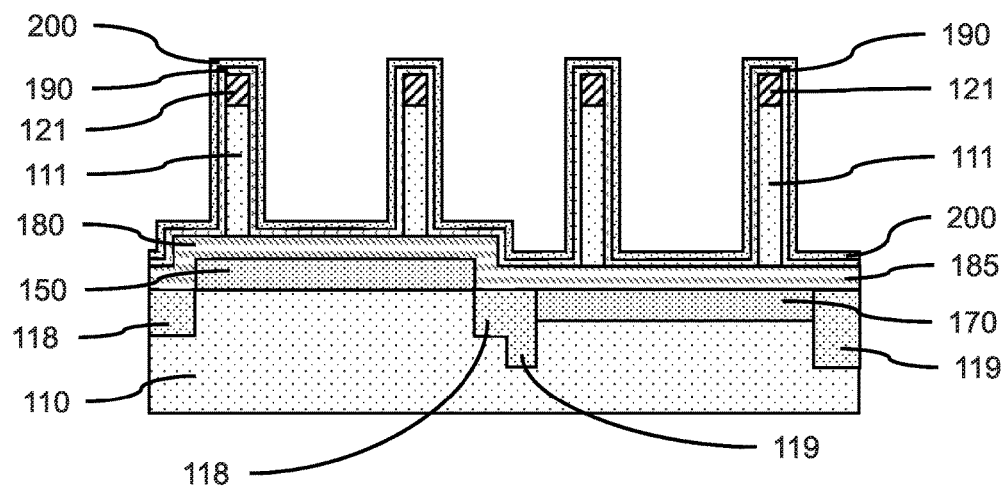
FIG. 15 is a cross-sectional side view showing a gate dielectric layer formed on the bottom spacer, and a work function layer formed on the gate dielectric layer, in accordance with an embodiment of the present invention.

FIG. 15 is a cross-sectional side view showing a gate dielectric layer formed on the bottom spacer, and a work function layer formed on the gate dielectric layer, in accordance with an embodiment of the present invention.

In one or more embodiments, a gate dielectric layer 190 can be formed on the vertical fins 111, fin templates 121, first bottom spacer 180, and second bottom spacer 185, where the gate dielectric layer 190 can be formed by a conformal deposition (e.g., ALD, PEALD) to control the layer thickness.

In various embodiments, the gate dielectric layer 190 can be silicon oxide (SiO), silicon nitride (SiN), a high-k dielectric, or a combination thereof. The gate dielectric layer 190 can be formed by a conformal deposition to control the layer thickness.

In one or more embodiments, a work function layer 200 can be formed on the gate dielectric layer. The work function layer 200 can be a transition metal nitride, a transition metal carbide, or a combination thereof.

Figure 16:
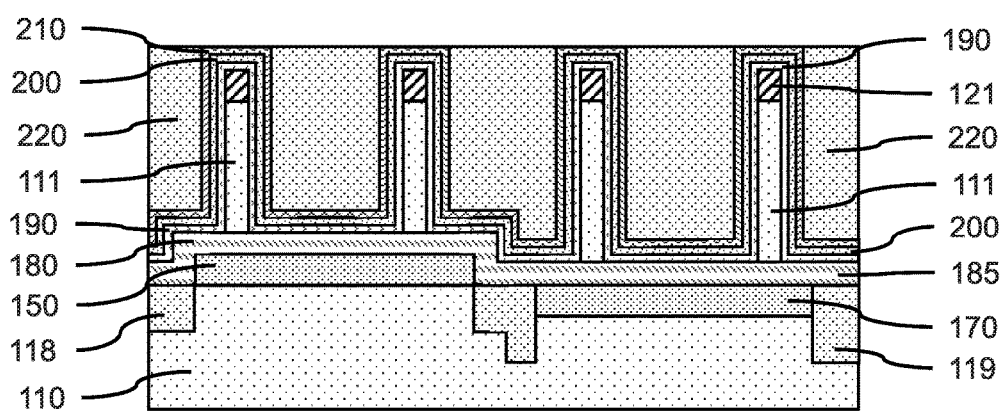
FIG. 16 is a cross-sectional side view showing a capping layer formed on the work function layer, and a fill layer formed on the capping layer, in accordance with an embodiment of the present invention.

FIG. 16 is a cross-sectional side view showing a capping layer formed on the work function layer, and a fill layer formed on the capping layer, in accordance with an embodiment of the present invention.

In one or more embodiments, a capping layer 210 can be formed on the work function layer 200, where the capping layer 210 can be formed by a conformal deposition. The capping layer 210 can be silicon nitride (SiN).

In one or more embodiments, a fill layer 220 can be formed on the capping layer 210, where the fill layer covers the vertical fins 111 and fin templates 121. The fill layer 220 can be formed by a blanket deposition that fills in the spaces between vertical fins 111. The capping layer 210 can be silicon oxide (SiO).

The capping layer 210 and fill layer 220 can encapsulate the gate structure formed by the gate dielectric 190 and work function layer 200, where the capping layer 210 and fill layer 220 can electrically isolate the gate structures.

In various embodiments, the fill layer can be deposited over the fin templates 121, and a chemical-mechanical polishing (CMP) used to reduce the height of the fill layer 220 to expose the top surface of the capping layer 210 and provide a smooth, flat surface.

Figure 17:
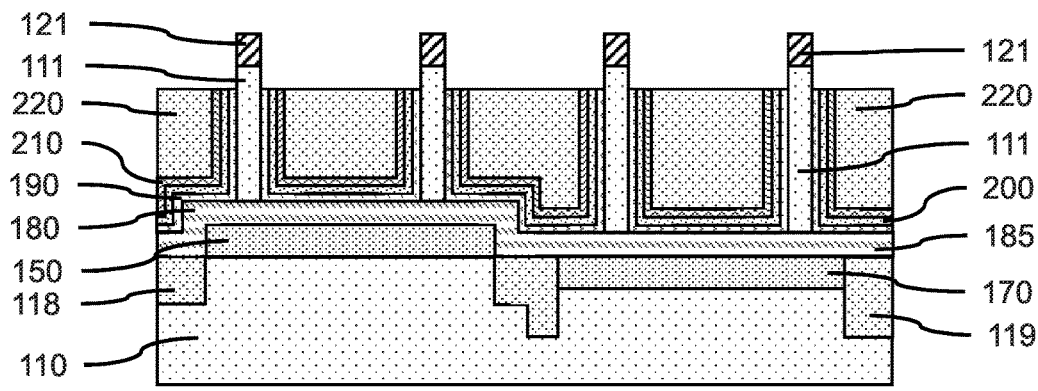
FIG. 17 is a cross-sectional side view showing a recessed fill layer, capping layer, work function layer, and gate dielectric layer, in accordance with an embodiment of the present invention.

FIG. 17 is a cross-sectional side view showing a recessed fill layer, capping layer, work function layer, and gate dielectric layer, in accordance with an embodiment of the present invention.

In one or more embodiments, the heights of the fill layer 220, capping layer 210, work function layer 200, and gate dielectric layer 190 can be reduced to form a recess. An upper portion of the vertical fins 111 can be exposed by formation of the recess. A non-selective directional etch or series of selective etches can be used to reduce the heights of the fill layer 220, capping layer 210, work function layer 200, and gate dielectric layer 190.

Figure 18:
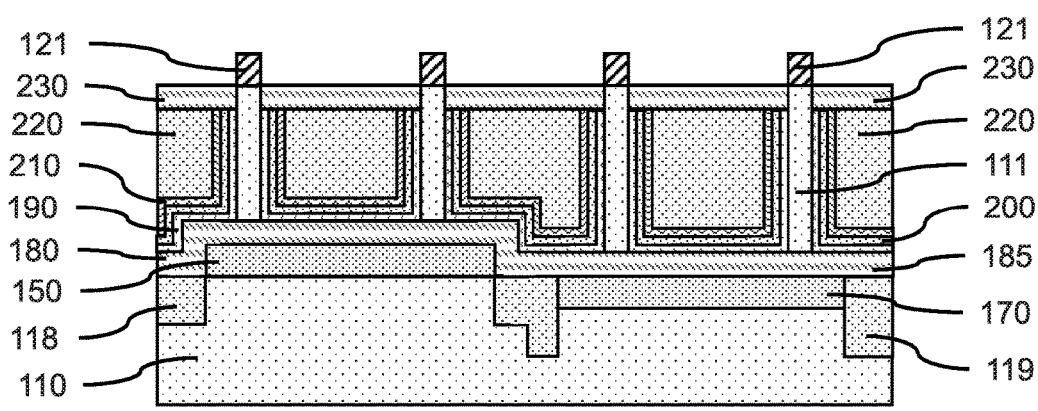
FIG. 18 is a cross-sectional side view showing a top spacer formed on the recessed fill layer, capping layer, work function layer, and gate dielectric layer, in accordance with an embodiment of the present invention.

FIG. 18 is a cross-sectional side view showing a top spacer formed on the recessed fill layer, capping layer, work function layer, and gate dielectric layer, in accordance with an embodiment of the present invention.

In one or more embodiments, a top spacer 230 can be formed on the vertical fins 111, fill layer 220, capping layer 210, work function layer 200, and gate dielectric layer 190.

The top spacer 230 can be blanket deposited and etched back. The fin templates 121 can be exposed above the top spacer 230.

Figure 19:
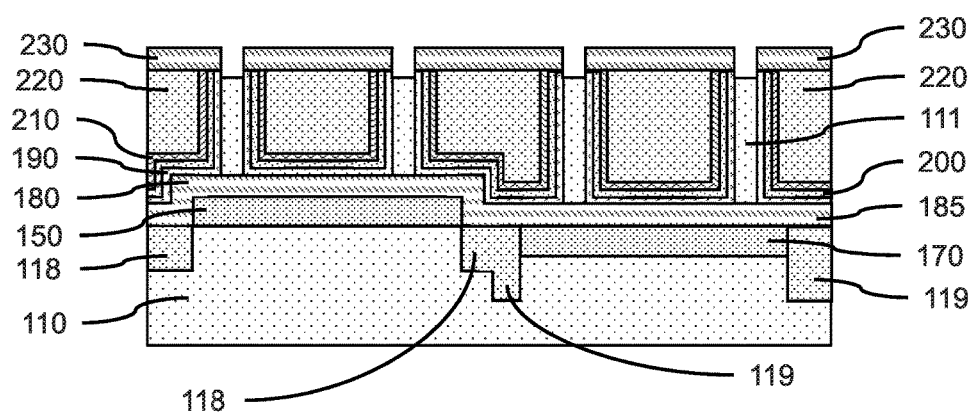
FIG. 19 is a cross-sectional side view showing recessed vertical fins after removal of the fin templates, in accordance with an embodiment of the present invention.

FIG. 19 is a cross-sectional side view showing recessed vertical fins after removal of the fin templates, in accordance with an embodiment of the present invention.

The exposed fin templates 121 can be removed to expose the underlying top surface of the vertical fins 111, where the fin templates 121 can be removed using a selective etch.

An upper portion of the vertical fins can be removed to form trenches in the top spacer 230, where the top surface of the vertical fins 111 can be reduced below the bottom surface of the top spacer 230.

Figure 20:
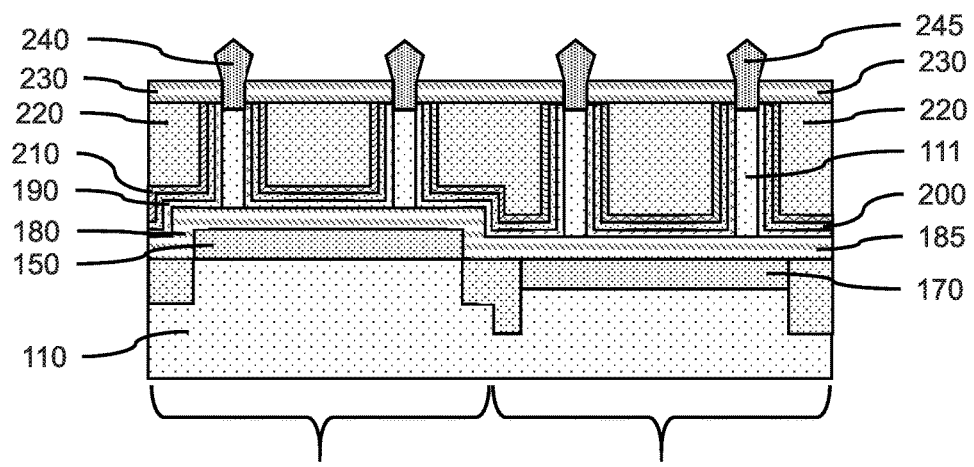
FIG. 20 is a cross-sectional side view showing top source/drains formed on the top surfaces of the vertical fins, in accordance with an embodiment of the present invention.

FIG. 20 is a cross-sectional side view showing top source/drains formed on the top surfaces of the vertical fins, in accordance with an embodiment of the present invention.

In one or more embodiments, top source/drains 240, 245 can be formed on the exposed top surfaces of the vertical fins 111. The top source/drains 240, 245 can be epitaxially grown on single crystal vertical fins 111, where the top source/drains 240, 245 can extend above the top surface of the top spacer 230.

In various embodiments, the vertical fins 111 on the first region 101 of the substrate can have a height in the range of about 20 nm to about 80 nm, or in the range of about 30 nm to about 60 nm, although other heights are also contemplated. The vertical fins 111 on the second region 102 of the substrate can have a height in the range of about 35 nm to about 130 nm, or in the range of about 50 nm to about 95 nm, although other heights are also contemplated. In various embodiments, the vertical fins 111 on the first region 101 of the substrate can have a difference in height from the vertical fins 111 on the second region 102 in the range of about 15 nm to about 50 nm, or in the range of about 20 nm to about 35 nm.

In one or more embodiments, the first bottom source/drain 150 and first top source/drains 240 can be an n-type source/drains on the first region 101, and the second bottom source/drain 170 and second top source/drains 245 can be a p-type source/drains on the second region 102. In various embodiments, the first bottom source/drain 150 and first top source/drains 240 can be the same polarity as the second bottom source/drain 170 and second top source/drains 245, where the different channel lengths affect the It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of vertical transport fin field effect transistors having different channel lengths and methods of fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming multiple vertical transport fin field effect transistors (VT FinFETs) having different channel lengths, comprising:
    forming a vertical fin on a first region of a substrate and a vertical fin on a second region of the substrate;
    forming a first bottom source/drain on the first region of the substrate, wherein the first bottom source/drain is grown on the first region of the substrate to cover a lower portion of the vertical fin on the first region of the substrate; and
    forming a second bottom source/drain in the second region of the substrate, wherein the second bottom source/drain does not cover a lower portion of the vertical fin on the second region.

2. The method of claim 1, wherein the vertical fin on the first region of the substrate and the vertical fin on the second region of the substrate have a height in the range of about 20 nm to about 80 nm.

3. The method of claim 1, further comprising recessing the substrate surface by removing an upper portion of the substrate to form fin extensions below the vertical fin on the first region of the substrate and the vertical fin on the second region of the substrate.

4. The method of claim 3, wherein the substrate is recessed to a depth in the range of about 15 nm to about 50 nm.

5. The method of claim 3, wherein the first bottom source/drain covers the fin extension below the vertical fin on the first region.

6. The method of claim 5, wherein the first bottom source/drain and second bottom source/drain are heat treated to cause diffusion of dopants from the first bottom source/drain and second bottom source/drain into adjoining portions of the vertical fins and substrate.

7. The method of claim 6, further comprising forming a bottom spacer on the first region and the second region at the same time.

8. The method of claim 7, wherein the bottom spacer is formed on the first region and the second region by an ion beam deposition.

9. The method of claim 8, further comprising forming a gate structure on the bottom spacer and vertical fins on the first region and the second region.

10. A method of forming multiple vertical transport fin field effect transistors (VT FinFETs) having different channel lengths, comprising:
    forming a plurality of vertical fins on a substrate, where at least one of the plurality of vertical fins is on a first region of the substrate and at least one of the plurality of vertical fins is on a second region of the substrate;
    forming a first bottom source/drain on the first region of the substrate, wherein the first bottom source/drain is formed by epitaxial growth on the first region of the substrate;
    forming a second bottom source/drain in the second region of the substrate, wherein the second bottom source/drain is formed by ion implantation into the second region of the substrate, and wherein the first bottom source/drain and second bottom source/drain are at two different elevations on the substrate; and
    forming a first bottom spacer on the first bottom source/drain on the first region of the substrate, and a second bottom spacer on the second bottom source/drain on the second region of the substrate.

11. The method of claim 10, wherein the first bottom source/drain is grown on the first region of the substrate to a height in the range of about 15 nm to about 50 nm.

12. The method of claim 10, further comprising forming a protective inner liner on the plurality of vertical fins, and recessing the substrate to form fin extensions below each of the vertical fins.

13. The method of claim 12, wherein the first bottom source/drain covers the fin extensions below the at least one of the plurality of vertical fins on the first region.

14. The method of claim 12, further comprising forming a protective outer liner on the protective inner liner and first bottom source/drain.

15. The method of claim 14, wherein the first bottom source/drain is an n-type bottom source/drain, and the second bottom source/drain is a p-type bottom source/drain.

16. A method of forming multiple vertical transport fin field effect transistors (VT FinFETs) having different channel lengths, comprising:
    forming a vertical fin on a first region of a substrate and a vertical fin on a second region of the substrate;

forming a protective inner liner on the vertical fin on the first region and the vertical fin on the second region;

recessing the substrate surface by removing an upper portion of the substrate to form a fin extension below the protective inner liner on the vertical fin on the first region and the protective inner liner on the vertical fin on the second region of the substrate; and forming a first bottom source/drain on the first region of the substrate, wherein the first bottom source/drain covers the fin extension below the protective inner liner on the vertical fin on the first region.

17. The method of claim 16, wherein the first bottom source/drain has a thickness in the range of about 15 nm to about 50 nm.

18. The method of claim 16, further comprising forming a second bottom source/drain in the second region of the substrate, wherein the second bottom source/drain does not cover the fin extension below the protective inner liner on the vertical fin on the second region of the substrate.

19. The method of claim 18, wherein the second bottom source/drain is formed by ion implantation into the second region of the substrate, and wherein the first bottom source/drain and second bottom source/drain are at two different elevations on the substrate.

20. The method of claim 19, wherein the vertical fin on the first region has a difference in height from the vertical fin on the second region in the range of about 15 nm to about 50 nm.

\* \* \* \* \*